United States Patent [19]

Cohen et al.

[11] 4,227,943

[45] Oct. 14, 1980

[54] SCHOTTKY BARRIER SOLAR CELL

[75] Inventors: Marshall J. Cohen; James S. Harris, Jr., both of Thousand Oaks, Calif.

[73] Assignee: Rockwell International Corporation, El Segundo, Calif.

[21] Appl. No.: 45,502

[22] Filed: Jun. 4, 1979

[51] Int. Cl.$^3$ .............................................. H01L 31/04
[52] U.S. Cl. .................................... 136/255; 136/261; 136/262; 357/15; 357/30; 357/61
[58] Field of Search ......... 136/89 SJ, 89 GA, 89 SG; 357/15, 30, 61

[56] References Cited

U.S. PATENT DOCUMENTS 4,084,172  4/1978  Scranton et al. ..................... 357/15

*Primary Examiner*—Aaron Weisstuch
*Attorney, Agent, or Firm*—L. Lee Humphries; Craig O. Malin

[57] ABSTRACT

A solar cell is constructed by coating an n-type conductivity semiconductor with a thin layer of bromine doped, polymeric sulfur-nitride, $(SNBr_{0.4})_x$. Metal deposits are provided on both materials for making electrical contact to the cell. In a preferred embodiment, the semiconductor is silicon. In a second preferred embodiment, the semiconductor is GaAs on an $n^+$-type conductivity GaAs substrate.

7 Claims, 3 Drawing Figures

SCHOTTKY BARRIER SOLAR CELL

BACKGROUND OF THE INVENTION

1. Field of the Invention

This invention is in the field of solar cells.

2. Description of the Prior Art

Conventional solar cells use a p-n junction within a semiconductor to obtain a current from photons absorbed near the junction. Germanium has been used for a p-n junction solar cell, although in recent years gallium arsenide, GaAs, has found increasing use in high-performance devices because of the excellent match of its band gap to the solar spectrum.

As a direct band gap material, GaAs is highly absorbing to photons with $\hbar\omega \geq E_g$. GaAs p-n junction solar cells must thus be fabricated with shallow junctions and are subject to reduced collection efficiencies due to significant surface recombination. More sophisticated techniques such as the addition of an $Al_xGa_{1-x}As$ "window" to isolate the junction from the surface are expensive and will likely find application principally in space and concentrator solar-cell arrays where low cost is not the major requirement.

An alternate approach to the development of low-cost solar cells is through the use of metal-semiconductor Schottky barriers to replace the semiconductor-semiconductor p-n junction. Schottky barriers are adaptable to low-cost large-area fabrication techniques and are suitable for polycrystalline devices. In addition, since the collecting junction is at the surface of the device, there is increased short-wavelength response and the collection efficiency is improved through reduced surface recombination. The principal drawback of Schottky-barrier solar cells is that, for a given semiconductor, the metal-semiconductor barrier is significantly smaller than the p-n junction barrier, resulting in a lower open-circuit voltage, $V_{oc}$. In GaAs, for example, $V_{oc}$ is about 0.5 V for a Schottky-barrier cell versus $V_{oc}$ of about 1.0 V for a p-n junction cell. Despite the increased current collection, the voltage at which it can be drawn is reduced, resulting in much lower power outputs.

SUMMARY OF THE INVENTION

It is an object of the invention to provide an efficient solar cell.

It is an object of the invention to provide a low cost solar cell.

According to the invention, the surface of an n-type conductivity semiconductor is coated with a thin (less than 300 Å) layer of bromine doped, polymeric sulfur-nitride, $(SNBr_{0.4})x$, to form the light receiving surface of a solar cell. Metal contacts are provided on the semiconductor and on the polymeric layer for taking power out of the cell. In a preferred embodiment, the semiconductor is silicon. In a second preferred embodiment, the semiconductor is GaAs on an n+-type conductivity GaAs substrate.

These and other objects and features of the invention will be apparent from the following detailed description, taken with reference to the accompanying drawings.

DESCRIPTION OF THE PREFERRED EMBODIMENT

Polymeric sulfur-nitride, $(SN)x$, is a relatively new material, and is classified as a metallic polymer because of its high conductivity compared to conventional polymers. Its band structure is that of a highly anisotropic semimetal with a dc conductivity along the polymer chains greater than $10^3$ $(\Omega\ cm)^{-1}$ at room temperature increasing to greater than $10^6$ $(\Omega\ cm)^{-1}$ at 4.2° K. The anisotropy in the conductivity, $\sigma_{11}/\sigma_{1}$, is of order $10^2$ at room temperature. The optical properties are similarly anisotropic. It exhibits free-carrier properties with a plasmon edge in the visible for light polarized along the polymer chains and an edge in the infrared for perpendicularly polarized light. Barrier-height measurements of $(SN)_x$ on various semiconducting substrates indicate that its work function appears to be larger than those of the elemental metals. Other properties of $(SN)_x$ and methods for preparing it are described by C. M. Mikulski et al in the *Journal of the American Chemical Society*, vol. 97, page 6358, 1975.

Polymeric $(SN)_x$ has been deposited on ZnS and ZnSe to form high potential Schottky barriers (R. A. Scranton, et al, *Applied Physics Letters*, vol. 29, page 47, 1976). However, until the present invention, it has not been used to fabricate solar cells.

Although $(SN)_x$ is transparent to light polarized perpendicular to its polymer chain direction, it reflects light polarized parallel to its polymer chain direction (A. A. Bright et al, *Applied Physics Letters*, vol. 26, page 612, 1975). This optical anisotropy reduces the usefulness of $(SN)_x$ for solar cells because the energy in the reflected light is wasted. This problem is overcome in the present invention by doping the $(SN)_x$ to form a conductive polymer identified as $(SNBr_{0.4})_x$. The bromine doping greatly reduces the optical anisotropy of the $(SN)_x$ and makes it transparent to both polarizations.

Figure 1:
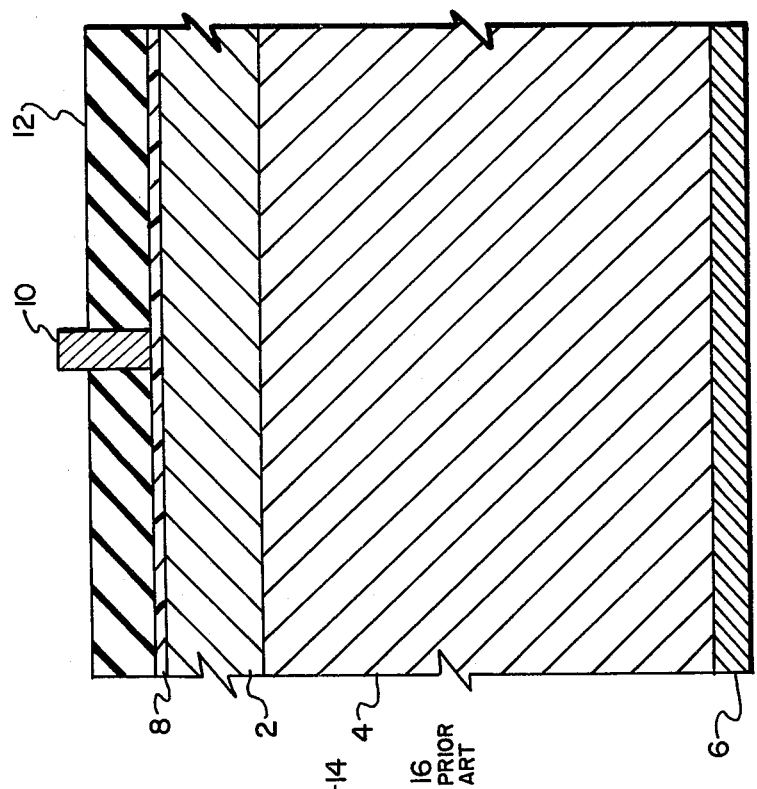
FIG. 1 is an illustration showing the cross-section of a solar cell according to the invention.

FIG. 1 shows a solar cell structure according to a preferred embodiment of the invention. The semiconductor used for the cell is a 3 μm thick GaAs layer 2 of n-type conductivity $(N_D = 10^{16}\ cm^{-3})$ epitaxially grown on an n+-type conductivity $(N_D = 10^{18}\ cm^{-3})$ GaAs substrate 4.

1500 Å of Au-Ge followed by 200 Å of Pt were deposited on the back surface of substrate 4 and alloyed in an Ar atmosphere for 2 min at 450° C. to form ohmic contact 6. The layers were cleaved into two sections and one was mounted with photoresist on the water-cooled cold finger of an $(SN)_x$ sublimator. The other sample was set aside as a reference in order to determine the difference between the open-circuit voltage, $V_{oc}$, resulting from $(SN)_x$ and the $V_{oc}$ resulting from a native oxide on the GaAs.

To minimize the possibility of nonconducting SN contaminants in the film at the start of the growth, the sublimator cold finger was left at room temperature and a 77° K. trap was inserted between the sublimator and the vacuum system. The $(SN)_x$ used was "high-purity" material which had been polymerized for more than seven weeks. Mass spectroscopic studies of such material have shown it to be essentially free of unpolymerized SN compounds. The temperature of the sublimator's oil bath was raised to 148° C. and held there for 15 min, at which point the liquid-nitrogen trap was warmed to room temperature and the cooling water turned on in the sublimator cold finger. Approximately 30 min of growth resulted in a barely visisble (100–200 Å) layer 8 of $(SN)_x$ on the GaAs. This polymeric layer 8 should be kept to a thickness less than 300 Å so that the maximum amount of light is transmitted to the semiconductor junction.

An array of gold contacts 10 was deposited on $(SN)_x$ layer 8 to complete an undoped $(SN)_x$ solar cell. To improve the performance of the cell and to protect $(SN)_x$ layer 8 from degrading during long exposure to the atmosphere, a standard antireflection coating 12 such as 1,000 to 10,000 Å of $Ta_2O_5$ can be deposited over $(SN)_x$ layer 8.

The $(SNBr_{0.4})_x$ Schottky barrier solar cell of the present invention is produced in a manner similar to the undoped cell except that $(SN)_x$ layer 8 is exposed to bromine vapor at 20 torrs for 15 minutes at room temperature prior to depositing gold contacts 10. This doping operation converts layer 8 from $(SN)_x$ to $(SNBr_{0.4})_x$. Gold contacts 10 and antireflection coating 12 may then be deposited on $(SNBr_{0.4})_x$ layer 8.

The previously mentioned reference sample which did not have $(SN)_x$ deposited on the GaAs layer was placed in an e-beam evaporator and a 50 to 60 Å thick layer of gold was deposited to create a metal-Schottky barrier with the GaAs. An array of gold contacts was then deposited on the thin gold layer to complete the reference solar cell.

Figure 2:
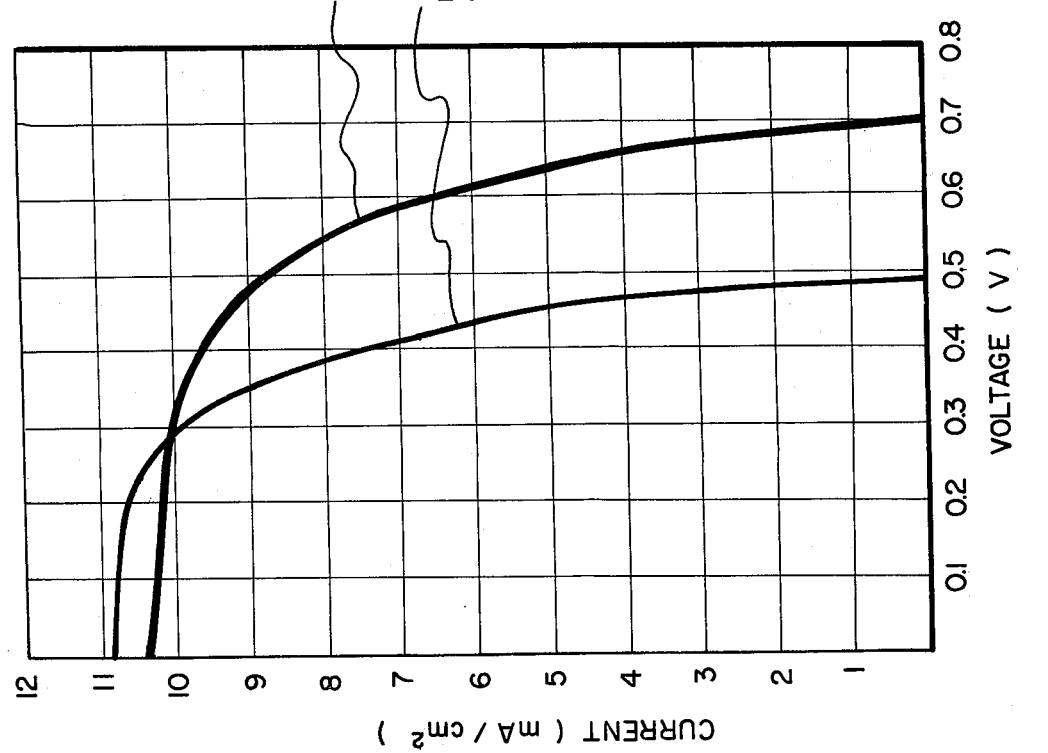
FIG. 2 shows current-voltage characteristic curves of a gold Schottky-barrier solar cell, and of a polymeric Schottky-barrier solar cell similar to the present invention except the polymer is not doped with bromine.

FIG. 2 shows the illuminated current-voltage characteristics of the $(SN)_x$-GaAs solar cell (curve 14) and of the gold-GaAs reference solar cell (curve 16). The illumination used was sunlight with an intensity of 70 $mW/cm^2$. The open-circuit voltage of the $(SN)_x$-GaAs solar cell has 0.705 V versus 0.492 V for the reference Au-GaAs cell. This represents an enhancement of 43%. The experiment was repeated on three separate $(SN)_x$ growths each yielding 8–10 individual 2×2-mm cells. The 26 cells tested had open-circuit voltages ranging from a low of 0.68 V to a high of 0.71 V. The short-circuit current density $J_{sc}$ of the $(SN)_x$-GaAs cell (10.3 $mA/cm^2$) is nearly that of the Au-GaAs cell (10.8 $mA/cm^2$). Both cells have fill factors, ff, of 60% (due to the high sheet resistance of the thin top surface contact metal), resulting in an efficiency of 6.2% for the $(SN)_x$-GaAs cell versus 4.6% for the Au-GaAs cell. The measurements were made without antireflection coatings which would increase the short-circuit current densities.

The current-voltage characteristics of the $(SNBr_{0.4})_x$-Gaas solar cell would be similar to that of the $(SN)_x$-GaAs solar cell (curve 14) except that the current would be considerably higher at all voltages below the open circuit voltage. The higher current results predominately from the fact that bromine doping doubles the transmission of the solar spectrum because the doped layer is transparent to both polarizations. Further adding to the increased current is the fact that bromine doping also lowers the resistivity of the polymer layer.

Figure 3:
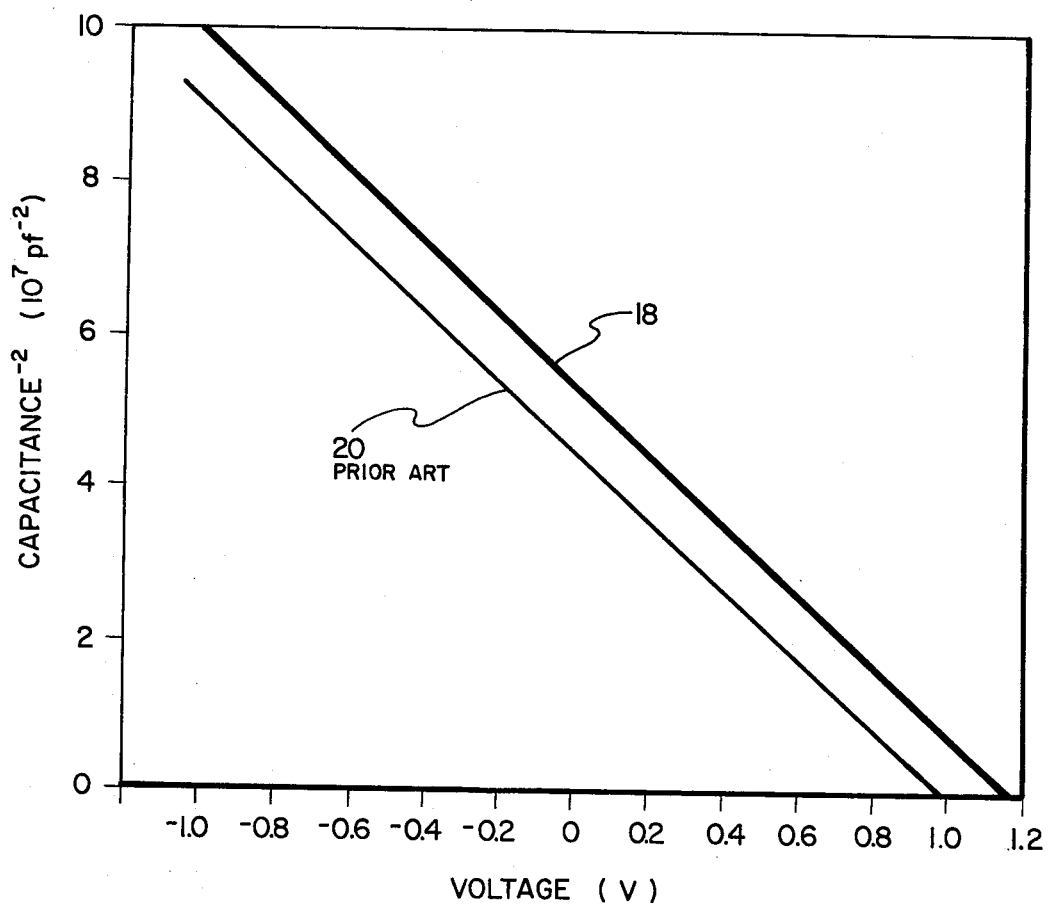
FIG. 3 shows capacitance-voltage characteristic curves for a gold Schottky-barrier solar cell and for a polymeric Schottky-barrier solar cell.

FIG. 3 shows the capacitance-voltage characteristics of the $(SN)_x$-GaAs solar cell (curve 18), and of the gold-GaAs solar cell (curve 20). The curve for the $(SNBr_{0.4})_x$-GaAs solar cell would be the same as curve 18. It can be seen from FIG. 3 that the Schottky barrier height of the polymeric solar cells is approximately 0.2 eV greater than that of the gold-GaAs solar cells.

The invention is applicable for solar cells made of semiconductors other than GaAs. For example, similar tests run on cells made by depositing $(SN)_x$ on silicon have also shown enhancement in the open circuit voltage of over 40% as compared to metal-silicon solar cells.

Although the invention has been explained using single (epitaxial) crystal semiconductors, it is also applicable to polycrystalline semiconductors. Although single crystal semiconductors are more efficient than polycrystalline semiconductors, the use of $(SNBr_{0.4})x$ rather than metal to form the Schottky barrier improves the performance of both.

In addition to enhanced performance, $(SNBr_{0.4})_x$-semiconductor solar cells are cheaper than metal-semiconductor solar cells because the polymer is cheaper than the gold used to fabricate the metal-semiconductor cells.

Numerous variations and modifications may be made without departing from the present invention. Accordingly, it should be clearly understood that the form of the invention described above and shown in the accompanying drawings is illustrative only and is not intended to limit the scope of the invention.

What is claimed is:

1. A Schottky-barrier type solar cell comprising:
   an n-type conductivity semiconductor;
   an $(SN)_x$ coating less than 300 Å thick on a top surface of said semiconductor, said $(SN)_x$ coating being doped with Br; and
   contact means for electrically contacting said semiconductor and said bromine doped $(SN)_x$ coating.

2. The solar cell as claimed in claim 1, wherein said semiconductor comprises GaAs.

3. The solar cell as claimed in claim 1, wherein said semiconductor comprises Si.

4. The solar as claimed in claim 1, wherein said $(SN)_x$ coating is bromine doped to a composition of $(SNBr_{0.4})_x$.

5. The solar cell as claimed in claim 1, including a semiconductor substrate on a bottom surface of said semiconductor.

6. The solar cell as claimed in claim 5, wherein said contact means comprises a film of metal on a bottom surface of said substrate and a metal conductor on a portion of a top surface of said coating.

7. A Schottky-barrier type solar cell comprising:
   an $N^+$-type conductivity GaAs substrate;
   an n-type conductivity GaAs layer on a top surface of said substrate;
   an $(SNBr_{0.4})_x$ coating less than 300 Å thick on a top surface of said layer; and
   metal contacts on said substrate and on said coating.

* * * * *